United States Patent
Ping et al.

(10) Patent No.: US 12,127,398 B2
(45) Date of Patent: Oct. 22, 2024

(54) METHOD FOR MANUFACTURING MEMORY USING PSEUDO BIT LINE STRUCTURES AND SACRIFICIAL LAYERS

(71) Applicant: CHANGXIN MEMORY TECHNOLOGIES, INC., Hefei (CN)

(72) Inventors: Er-Xuan Ping, Hefei (CN); Zhen Zhou, Hefei (CN); Lingguo Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 528 days.

(21) Appl. No.: 17/448,052

(22) Filed: Sep. 19, 2021

(65) Prior Publication Data

US 2022/0068937 A1    Mar. 3, 2022

Related U.S. Application Data

(63) Continuation of application No. PCT/CN2021/100327, filed on Jun. 16, 2021.

(30) Foreign Application Priority Data

Aug. 28, 2020 (CN) .......................... 202010886239.9

(51) Int. Cl.
H10B 12/00    (2023.01)
H01L 21/768   (2006.01)
H01L 23/538   (2006.01)

(52) U.S. Cl.
CPC ..... *H10B 12/485* (2023.02); *H01L 21/76841* (2013.01); *H01L 21/76877* (2013.01); *H01L 23/5384* (2013.01); *H10B 12/482* (2023.02)

(58) Field of Classification Search
CPC ................ H10B 12/485; H10B 12/482; H01L 21/76877; H01L 23/5384
See application file for complete search history.

(56) References Cited

U.S. PATENT DOCUMENTS 7,648,875 B2   1/2010   Hong
7,767,569 B2   8/2010   Maekawa
(Continued)

FOREIGN PATENT DOCUMENTS

CN   1959953 A      5/2007
CN   101075093 A    11/2007
(Continued)

OTHER PUBLICATIONS

International Search Report in the international application No. PCT/CN2021/100327, mailed on Sep. 9, 2021. 7 pages with English translation.
(Continued)

*Primary Examiner* — Jay C Chang
*Assistant Examiner* — Mikka Liu
(74) *Attorney, Agent, or Firm* — Syncoda LLC; Feng Ma

(57) ABSTRACT

A method for manufacturing a memory includes the following steps. A substrate and bit line contact layers are provided. Pseudo bit line structures are formed at tops of the bit line contact layers. Sacrificial layers filling regions between adjacent bit line structures are formed, and the sacrificial layers are located on side walls of the pseudo bit line structures and side walls of the bit line contact layers. After forming the sacrificial layers, the pseudo bit line structures are removed to form through holes exposing the bit line contact layers. Bit line conductive parts filling the through holes and covering the bit line contact layers are formed.

20 Claims, 7 Drawing Sheets

(56) References Cited

U.S. PATENT DOCUMENTS

| | | | |
|---|---|---|---|
| 7,846,827 B2 | 12/2010 | Kim | |
| 8,748,254 B2 | 6/2014 | Lee | |
| 9,691,700 B2 | 6/2017 | Kuroki | |
| 9,837,490 B2 | 12/2017 | Park et al. | |
| 10,181,473 B2 | 1/2019 | Feng et al. | |
| 10,453,849 B2 | 10/2019 | Liou et al. | |
| 10,461,153 B2 | 10/2019 | Lee et al. | |
| 10,600,790 B2 | 3/2020 | Feng et al. | |
| 10,622,249 B2 | 4/2020 | Yoon | |
| 10,763,264 B2 | 9/2020 | Liou et al. | |
| 10,886,276 B2 | 1/2021 | Hwang | |
| 10,923,390 B2 | 2/2021 | Yoon | |
| 2006/0146595 A1 | 7/2006 | Hong | |
| 2006/0148227 A1 | 7/2006 | Kronke | |
| 2007/0096188 A1 | 5/2007 | Maekawa | |
| 2010/0233878 A1 | 9/2010 | Kim | |
| 2012/0043642 A1 | 2/2012 | Kuroki | |
| 2013/0052787 A1 | 2/2013 | Lee | |
| 2017/0005166 A1 | 1/2017 | Park et al. | |
| 2017/0084613 A1 | 3/2017 | Hwang | |
| 2018/0226408 A1 | 8/2018 | Feng et al. | |
| 2019/0019805 A1* | 1/2019 | Feng | H10B 12/482 |
| 2019/0088739 A1 | 3/2019 | Lee et al. | |
| 2019/0103302 A1 | 4/2019 | Yoon | |
| 2019/0273083 A1 | 9/2019 | Liou et al. | |
| 2020/0013783 A1 | 1/2020 | Liou et al. | |
| 2020/0203213 A1 | 6/2020 | Yoon | |
| 2021/0035613 A1 | 2/2021 | Park | |

FOREIGN PATENT DOCUMENTS

| | | | |
|---|---|---|---|
| CN | 103730435 A | 4/2014 | |
| CN | 102347331 B | 12/2015 | |
| CN | 102543944 B | 6/2016 | |
| CN | 107482007 A | 12/2017 | |
| CN | 107611133 A | 1/2018 | |
| CN | 107611133 B | 8/2018 | |
| CN | 108389860 A | 8/2018 | |
| CN | 109148376 A | 1/2019 | |
| CN | 109244090 A | 1/2019 | |
| CN | 109524383 A | 3/2019 | |
| CN | 109962018 A | 7/2019 | |
| CN | 109979940 A | 7/2019 | |
| CN | 209216973 U | 8/2019 | |
| CN | 110223982 A | 9/2019 | |
| CN | 110491880 A | 11/2019 | |
| CN | 110890365 A | 3/2020 | |
| CN | 110957320 A | 4/2020 | |
| TW | I735860 B | * 8/2021 | |

OTHER PUBLICATIONS

International Search Report in the international application No. PCT/CN2021/106848, mailed on Oct. 19, 2021. 5 pages with English translation.

International Search Report in the international application No. PCT/CN2021/103864, mailed on Oct. 11, 2021. 5 pages with English translation.

International Search Report in the international application No. PCT/CN2021/103820, mailed on Aug. 31, 2021. 5 pages with English translation.

Written Opinion of the International Search Authority in the international application No. PCT/CN2021/100327, mailed on Sep. 9, 2021. 7 pages with English translation.

Written Opinion of the International Search Authority in the international application No. PCT/CN2021/106848, mailed on Oct. 19, 2021. 7 pages with English translation.

Written Opinion of the International Search Authority in the international application No. PCT/CN2021/103864, mailed on Oct. 11, 2021. 6 pages with English translation.

Written Opinion of the International Search Authority in the international application No. PCT/CN2021/103820, mailed on Aug. 31, 2021. 6 pages with English translation.

First Office Action of the U.S. Appl. No. 17/487,622, issued on May 25, 2023. 37 pages.

Notice of Restriction Requirement of the U.S. Appl. No. 17/479,162, issued on May 8, 2023. 8 pages.

* cited by examiner

METHOD FOR MANUFACTURING MEMORY USING PSEUDO BIT LINE STRUCTURES AND SACRIFICIAL LAYERS

CROSS-REFERENCE TO RELATED APPLICATIONS

This is a continuation of International Application No. PCT/CN2021/100327 filed on Jun. 16, 2021, which claims priority to Chinese Patent Application No. 202010886239.9 filed on Aug. 28, 2020. The disclosures of these applications are hereby incorporated by reference in their entireties.

BACKGROUND

A memory is a memory component used to store programs and various data information. A random access memory may be divided into a static random access memory and a dynamic random access memory. The dynamic random access memory usually includes a capacitor and a transistor connected to the capacitor. The capacitor is used to store charges representing stored information, and the transistor is a switch that controls inflow and release of charges of the capacitor. When data is written, a word line provides a high level, the transistor is switched on, and a bit line charges the capacitor. During reading, the word line also provides a high level, the transistor is switched on, and the capacitor is discharged to enable the bit line to obtain a read-out signal.

SUMMARY

Various embodiments of the present disclosure relate to the field of semiconductors, and more specifically to a method for manufacturing a memory and same.

Various embodiments of the present disclosure provide a method for manufacturing a memory. The method for manufacturing a memory includes the following steps. A substrate and a plurality of discrete bit line contact layers are provided, a plurality of active areas are provided in the substrate, and the bit line contact layers are one-to-one electrically connected to the active areas. Pseudo bit line structures are formed at tops of the bit line contact layers. Sacrificial layers filling regions between adjacent pseudo bit line structures are formed, and the sacrificial layer are located on side walls of the pseudo bit line structures and side walls of the bit line contact layers. After forming the sacrificial layers, the pseudo bit line structures are removed to form through holes exposing the bit line contact layers. Bit line conductive parts filling the through holes and covering the bit line contact layers are formed.

Various embodiments of the present disclosure further provide a memory manufactured by the aforementioned method. The memory includes a substrate, a plurality of discrete bit line contact layers, and bit line conductive parts. A plurality of active areas are provided in the substrate, and the bit line contact layers are one-to-one electrically connected to the active areas. The bit line conductive parts are located at tops of the bit line contact layers.

BRIEF DESCRIPTION OF THE DRAWINGS

One or more embodiments are exemplified by the corresponding accompanying drawings. These exemplified descriptions do not constitute a limitation to the embodiments. The accompanying drawings do not constitute scaling restrictions unless otherwise stated.

DETAILED DESCRIPTION

With continuous size reduction of a process node of the memory, the performance of the memory is to be improved. It was found through analysis that main reasons for performance reductions can include the following. When a bit line structure is formed by etching, a large number of involatile impurities remain in the bit line structure. Too many impurities increase the resistance of the bit line structure, resulting in reduced operating speed of the memory. In addition, as process nodes continue to miniaturized, a width of the bit line structure becomes narrower and narrower, and the bit line structure formed by etching is prone to tilt and collapse, thereby affecting the yield and service life of the memory.

In order to solve the above-mentioned problem, the embodiments of the present disclosure provide a method for manufacturing a memory. In the method, a bit line conductive part is formed by filling a through hole, avoiding the formation of the bit line conductive part by etching and reducing the content of impurities produced by etching in the bit line conductive part, thus reducing the resistance of the bit line conductive part. In addition, the bit line conductive part is supported by a sacrificial layer during the formation, so that the bit line conductive part is unlikely to tilt or collapse. Therefore, the yield of the memory is higher and the service life of the memory is longer.

In order to make the objectives, the technical solutions and the advantages of the embodiments of the present disclosure clearer, detailed descriptions will be made to all the embodiments of the present disclosure in combination with the accompanying drawings below. However, those of ordinary skill in the art can understand that in the various embodiments of the present disclosure, many technical details are presented in order to make the present disclosure better understood by readers. However, the technical solutions claimed in the present disclosure can also be implemented without these technical details and various changes and modifications based on the embodiments.

The first embodiment of the present disclosure provides a method for manufacturing a memory. FIG. 1 to FIG. 15 are schematic structural diagrams corresponding to all steps in the method.

Figure 1:
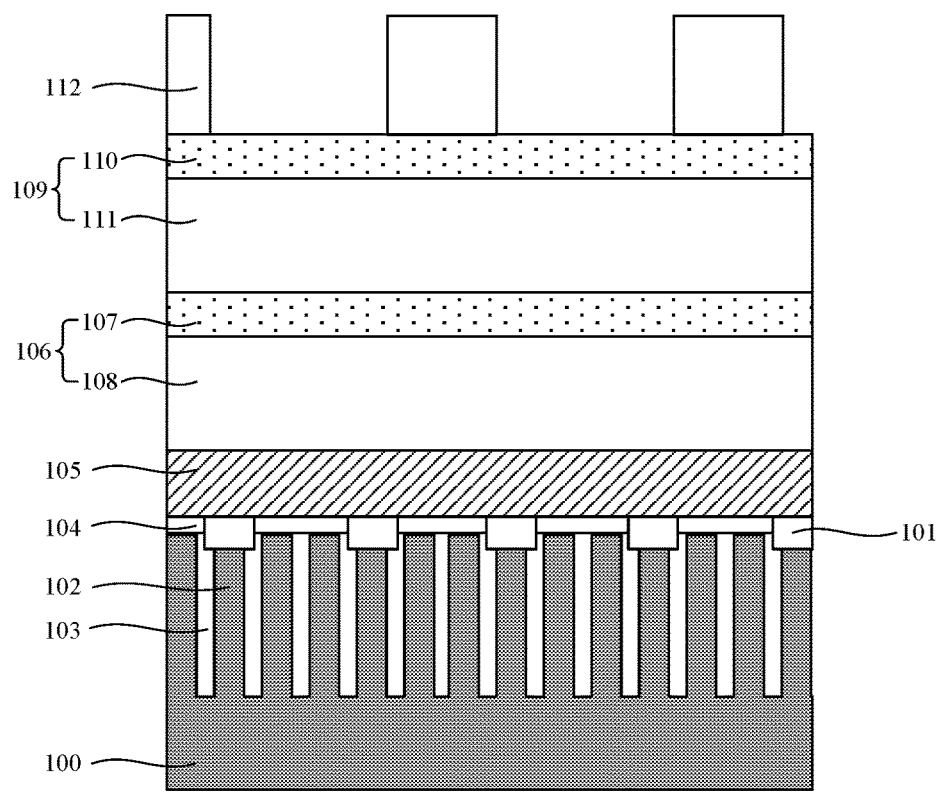
FIG. 1 is a first schematic structural diagram corresponding to a step in a method for manufacturing a memory provided in the first embodiment of the present disclosure.

Referring to FIG. 1, a substrate 100 and a plurality of discrete bit line contact layers 101 are provided. A plurality of active areas 102 are provided in the substrate 100, and each of the bit line contact layers 101 is one-to-one electrically connected to each of the active areas 102.

A material of the substrate 100 includes silicon, germanium, or other semiconductor materials.

A region between adjacent active areas 102 is filled with a first isolation layer 103 used to isolate the plurality of active areas 102. A material of the first isolation layer 103 is an insulation material, for example, silicon dioxide.

In the present embodiment, part of each bit line contact layer 101 is located in the substrate 100, and part thereof is higher than a surface of the substrate 100. The bit line contact layer 101 partially buried in the substrate 100 can reduce the parasitic capacitance of the memory and improve the performance of the memory. In other embodiments, the bit line contact layer can also be located on the surface of the substrate.

A material of the bit line contact layer 101 is a conductive material, such as polycrystalline silicon.

In the present embodiment, a second isolation layer 104 may also be formed on the surface of the substrate 100. The second isolation layer 104 fills a region between the discrete bit line contact layers 101 to isolate the plurality of bit line contact layers 101. A top of the second isolation layer 104 may be flush with the top of the bit line contact layer 101.

A material of the second isolation layer 104 is an insulation material, such as silicon nitride.

Referring to FIG. 1 to FIG. 6 in combination, a pseudo bit line structure 117 is formed on the top of the bit line contact layer 101.

The pseudo bit line structure 117 is used to define a position and size of a subsequently formed bit line structure. That is, the size of the pseudo bit line structure 117 is the same as the size of the subsequently formed bit line structure. Since the pseudo bit line structure 117 does not need to have a conductive characteristic, an insulation material can be used as the material of the pseudo bit line structure 117.

The step of forming the pseudo bit line structure 117 includes the following operations. A pseudo bit line layer 105 substrate covering the bit line contact layer 101 is formed on the substrate 100. A patterned mask layer 115 is formed on the pseudo bit line layer 105. The pseudo bit line layer 105 is etched by taking the patterned mask layer 115 as a mask to form the pseudo bit line structure 117.

Specifically, in the present embodiment, the pseudo bit line structure 117 is formed by a double patterning (SADP) method.

The method for forming the pseudo bit line structure 117 will be described in detail below in combination with the accompanying drawings.

Referring to FIG. 1, a pseudo bit line layer 105 covering the bit line contact layer 101 is formed on a substrate 100.

A bottom-layer mask layer 106 and a core layer 109 are sequentially stacked on the pseudo bit line layer 105. In the present embodiment, the bottom-layer mask layer 106 includes a first bottom-layer mask layer 107 and a second bottom-layer mask layer 108.

A material of the first bottom-layer mask layer 107 is different from that of the second bottom-layer mask layer 108. Specifically, the material of the first bottom-layer mask layer 107 may be silicon oxynitride, and the material of the second bottom-layer mask layer 108 may be hydrogen-containing silicon oxide.

It can be understood that, in other embodiments, the bottom-layer mask layer may also be of a single-layer structure.

In the present embodiment, the core layer 109 includes a first core layer 110 and a second core layer 111. A material of the first core layer 110 includes silicon oxynitride. A material of the second core layer 111 includes hydrogen-containing silicon oxide.

In other embodiments, the core layer may also be of a single-layer structure.

A patterned photoresist layer 112 is formed on the core layer 109.

Figure 2:
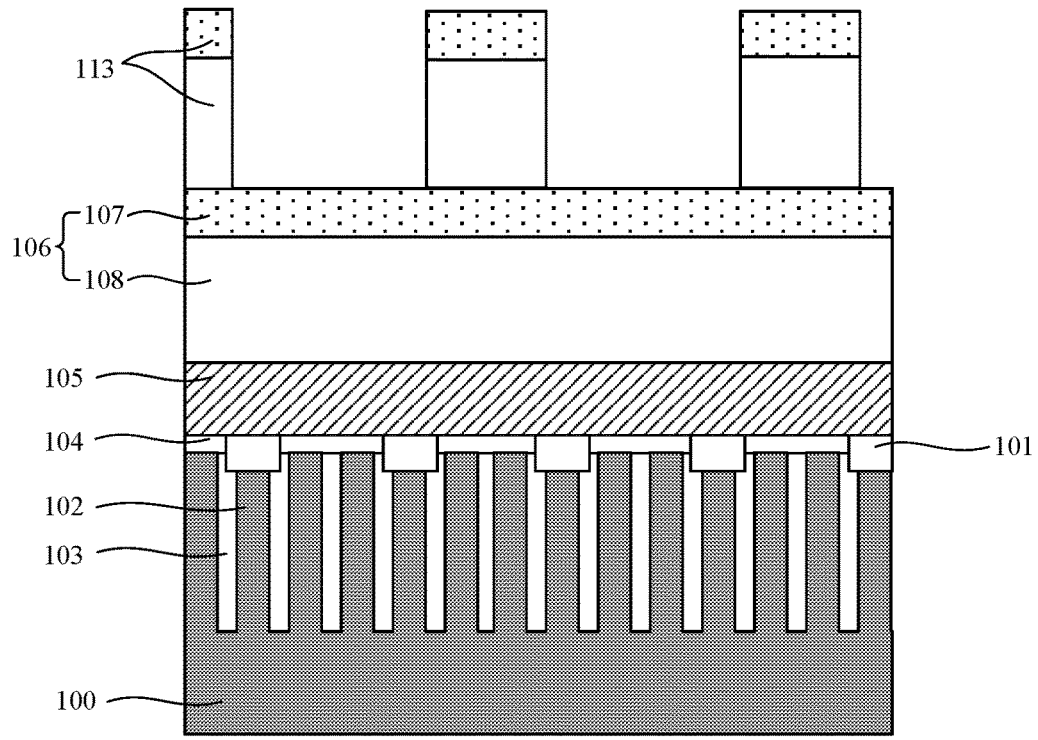
FIG. 2 is a second schematic structural diagram corresponding to a step in a method for manufacturing a memory provided in the first embodiment of the present disclosure.

Referring to FIG. 2, the core layer 109 (referring to FIG. 1) is etched by taking the patterned photoresist layer 112 (referring to FIG. 1) as a mask to form a plurality of discrete core parts 113. The core part 113 is of a double-layer structure. In other embodiments, the core part may also be of a single-layer structure.

After the core part 113 is formed, the patterned photoresist layer 112 is removed.

Figure 3:
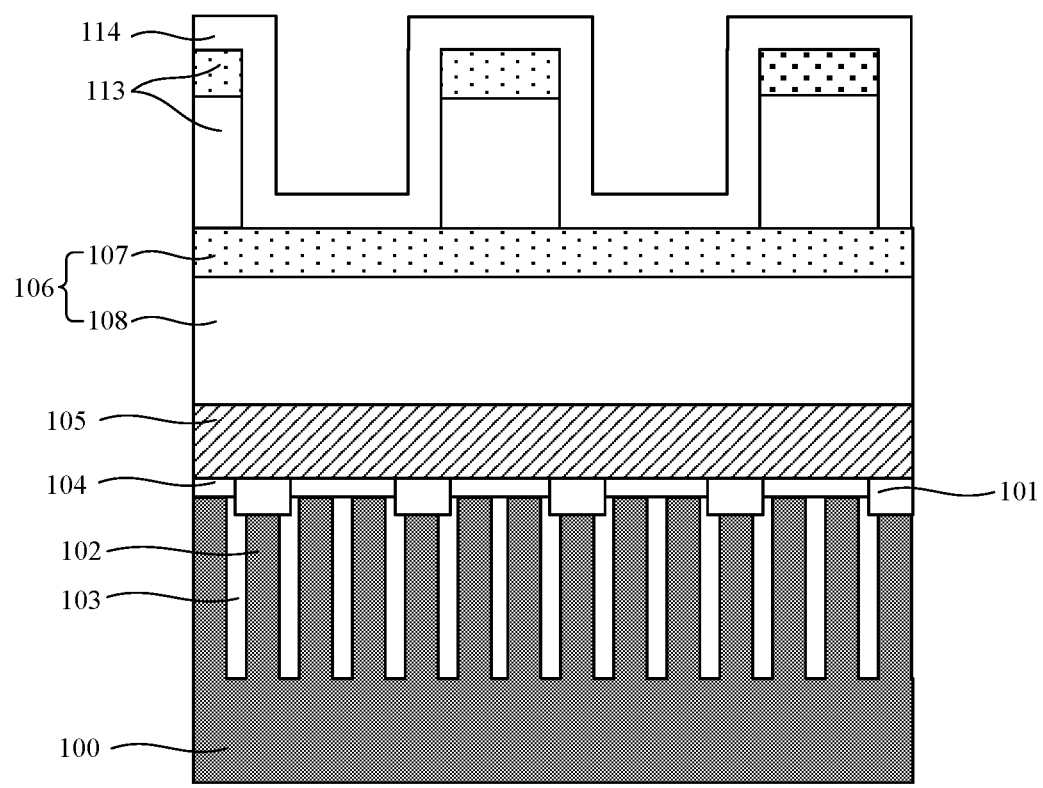
FIG. 3 is a third schematic structural diagram corresponding to a step in a method for manufacturing a memory provided in the first embodiment of the present disclosure.

Referring to FIG. 3, a side wall film 114 covering a top and a side wall of the core part 113 and the bottom-layer mask layer 106 is formed.

In the present embodiment, the side wall film 114 is deposited by an atomic layer deposition process which makes the thickness of the side wall film 114 more uniform. In other embodiments, the side wall film may be formed by chemical vapor deposition, physical vapor deposition, and other methods.

A material of the side wall film 114 is different from that of the core part 113, and may be silicon oxide, for example.

Figure 4:
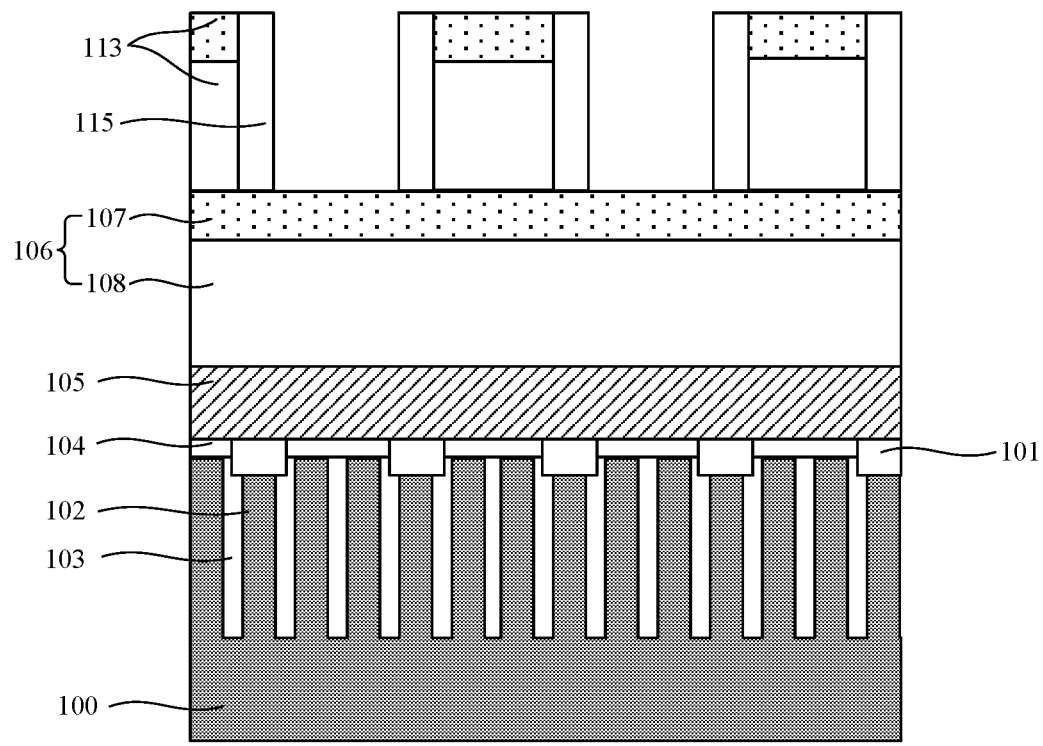
FIG. 4 is a fourth schematic structural diagram corresponding to a step in a method for manufacturing a memory provided in the first embodiment of the present disclosure.

Referring to FIG. 4, the side wall film 114 (referring to FIG. 3) is etched to form a side wall layer located on opposite side walls of the core part 113. Due to an etching load effect, that is, the larger the etching area, the easier it is to be etched. The side wall film 114 (referring to FIG. 3) deposited on the side wall of the core part 113 is not easily etched away, thereby forming the side wall layer.

Figure 5:
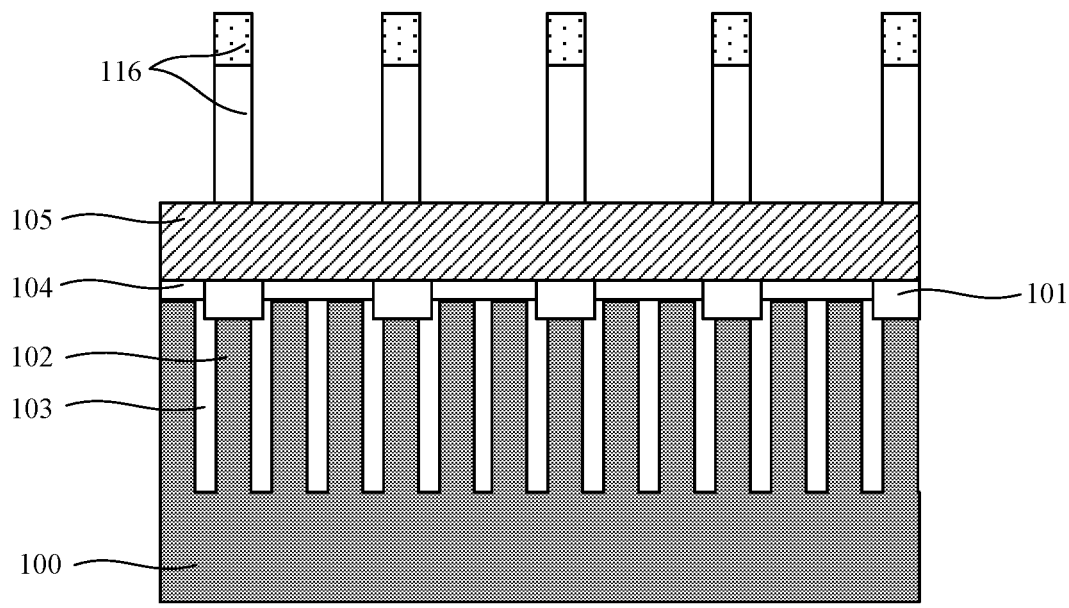
FIG. 5 is a fifth schematic structural diagram corresponding to a step in a method for manufacturing a memory provided in the first embodiment of the present disclosure.

Referring to FIG. 5, the core part 113 (referring to FIG. 4) is removed, and the side wall layer is used as the patterned mask layer 115.

The bottom-layer mask layer 106 (referring to FIG. 4) is etched by taking the patterned mask layer 115 as a mask to form a patterned bottom-layer mask layer 116. In the present embodiment, the patterned bottom-layer mask layer 116 is of a double-layer structure. In other embodiments, the patterned bottom-layer mask layer may also be of a single-layer structure.

Figure 6:
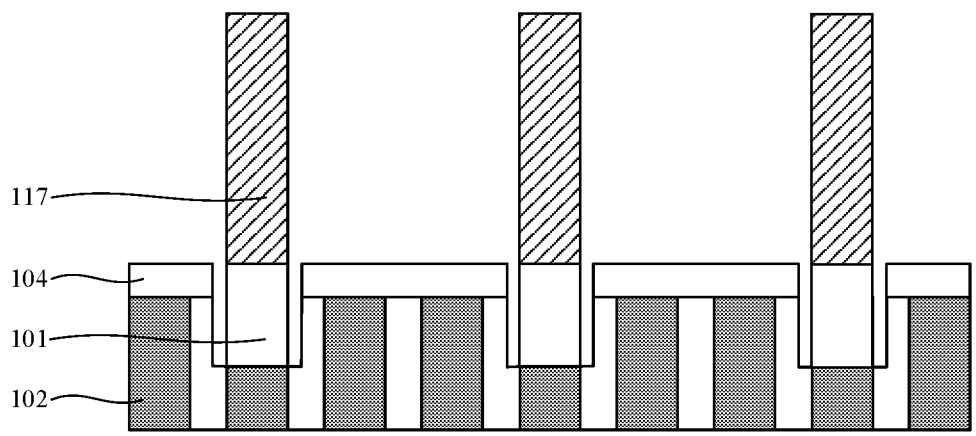
FIG. 6 is a sixth schematic structural diagram corresponding to a step in a method for manufacturing a memory provided in the first embodiment of the present disclosure.

Referring to FIG. 6, the pseudo bit line layer 105 (referring to FIG. 5) is etched by taking the patterned bottom-layer mask layer 116 (referring to FIG. 5) as a mask to form the pseudo bit line structure 117. After the pseudo bit line structure 117 is formed, the patterned bottom-layer mask layer 116 is removed.

In the present embodiment, the patterned mask layer 115 (referring to FIG. 4) transmits the pattern to the pseudo bit line structure 117 by the patterned bottom-layer mask layer 116. Therefore, a width of the pseudo bit line structure 117 is consistent with that of the patterned mask layer 115. The less the width of the patterned mask layer 115, the less the width of the pseudo bit line structure 117 and further the less the size of the memory.

The material of the pseudo bit line structure 117 includes silicon nitride, silicon oxynitride, or silicon carbonitride.

It is worth noting that in other embodiments, the pseudo bit line structure can be formed with a double patterning process not used. For example, a pseudo bit line structure may be formed as follows. A single-layer hard mask layer is directly formed on the pseudo bit line layer, and the hard mask layer is lithographed to form a plurality of discrete core parts on the pseudo bit line layer. A side wall film covering a top and a side wall of the core part and the pseudo bit line layer is formed. The side wall film is etched to form a side wall layer located on opposite side walls of the core part. The core part is removed. The side wall layer is a patterned mask layer. The pseudo bit line layer is etched using the patterned mask layer to form the pseudo bit line structure.

Figure 7:
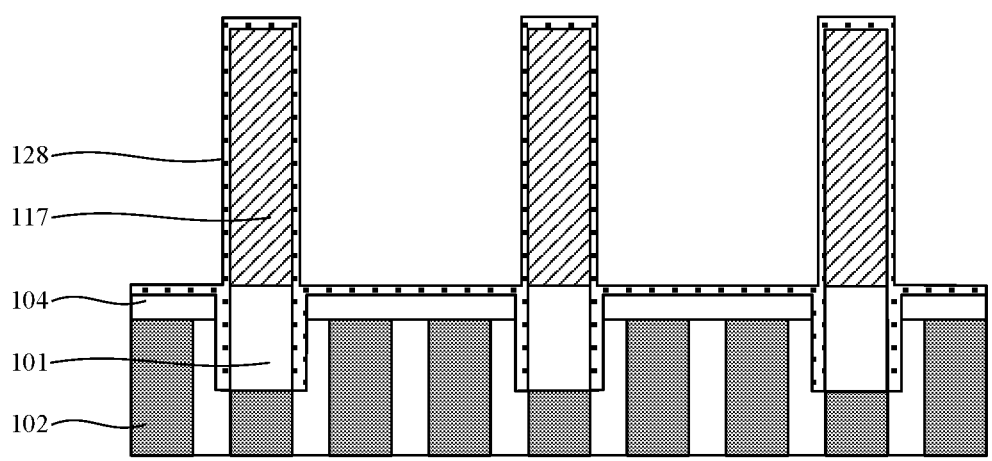
FIG. 7 is a seventh schematic structural diagram corresponding to a step in a method for manufacturing a memory provided in the first embodiment of the present disclosure.
Figure 8:
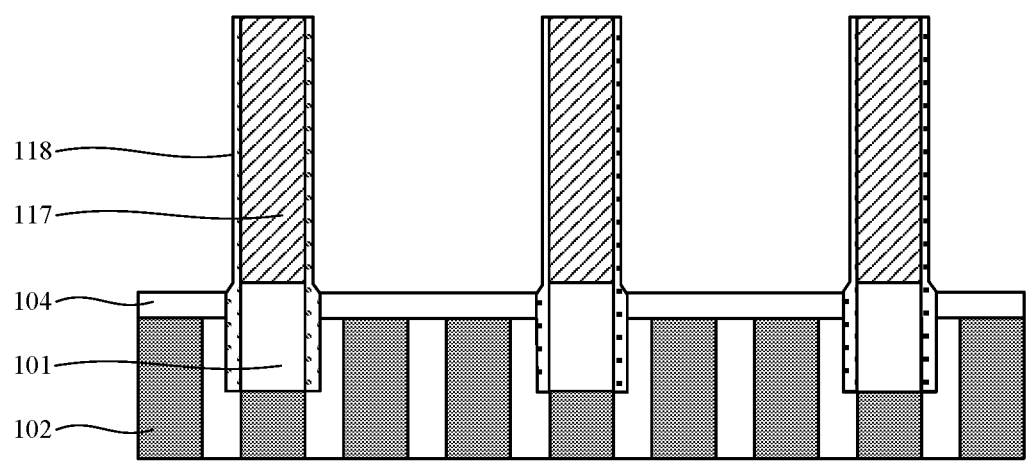
FIG. 8 is an eighth schematic structural diagram corresponding to a step in a method for manufacturing a memory provided in the first embodiment of the present disclosure.

Referring to FIG. 7 to FIG. 8, a dielectric layer 118 is formed on a side wall of the pseudo bit line structure 117 and the bit line contact layer 101.

In the process of subsequently etching to remove the sacrificial layer, the dielectric layer 118 can protect a bit line conductive part and ensure the accuracy of the shape and size of the bit line conductive part.

A material of the dielectric layer 118 includes a low-dielectric constant material which can reduce the parasitic capacitance of the memory and improve the operating speed of the memory.

Specifically, in the present embodiment, the steps for forming the dielectric layer 118 include the following operations. Referring to FIG. 7, an initial dielectric film 128 is also formed on a surface of the second isolation layer 104. Referring to FIG. 8, the initial dielectric film 128 (referring to FIG. 7) on the surface of the second isolation layer 104 and a top surface of the pseudo bit line structure 117 are removed.

It should be noted that in the present embodiment, the dielectric layers 118 and the bit line contact layer 101 define a through hole, and a bit line conductive part is subsequently formed in the through hole. Therefore, the dielectric layers 118 can also play a role of supporting the bit line conductive part. In other embodiments, the dielectric layer may not be formed, and the bit line conductive part is subsequently directly formed in the through hole between the sacrificial layers.

Figure 9:
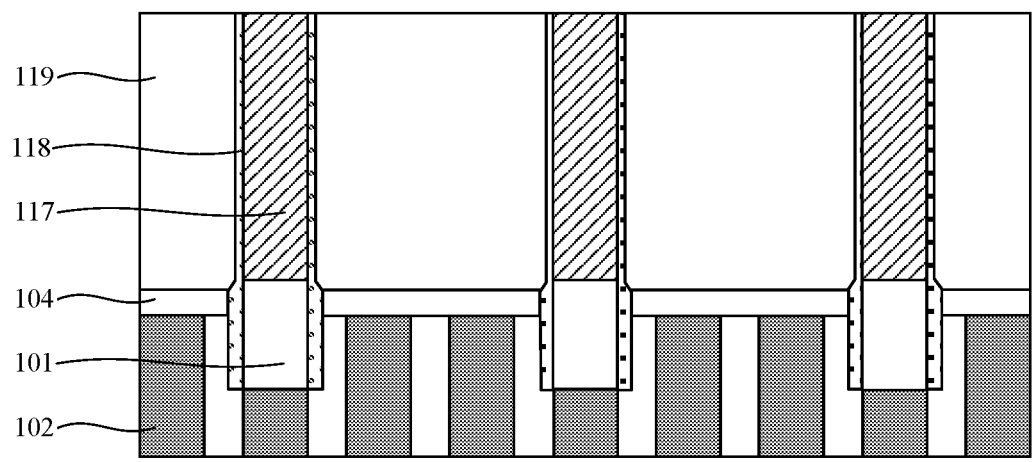
FIG. 9 is a ninth schematic structural diagram corresponding to a step in a method for manufacturing a memory provided in the first embodiment of the present disclosure.

Referring to FIG. 9, a sacrificial layer 119 filling the region between adjacent pseudo bit line structures 117 is formed, and is located on a side wall of the pseudo bit line structure 117 and a side wall of the bit line contact layer 101.

The sacrificial layer 119 also covers the surface of the second isolation layer 104 and a surface of the side wall of the dielectric layer 118.

A material of the sacrificial layer 119 is different from the material of the dielectric layer 118, and may be silicon oxide, for example.

Figure 10:
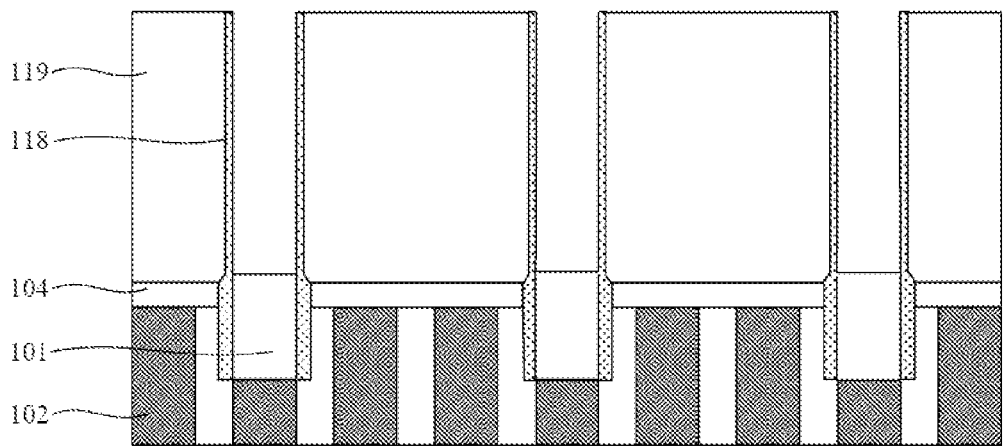
FIG. 10 is a tenth schematic structural diagram corresponding to a step in a method for manufacturing a memory provided in the first embodiment of the present disclosure.

Referring to FIG. 10, the pseudo bit line structure 117 (referring to FIG. 9) is removed, and a through hole exposing the bit line contact layer 101 is formed.

In the present embodiment, an etching rate of the pseudo bit line structure 117 is greater than an etching rate of the sacrificial layer 119, and an etching selectivity ratio of the material of the pseudo bit line structure 117 to the material of the sacrificial layer 119 is 5-15, such as 8, 10 or 13. The pseudo bit line structure 117 is removed by a wet etching method, and a hot phosphoric acid solution is used as an etching solvent. In other embodiments, the pseudo bit line structure may also be removed by a dry etching method.

Figure 11:
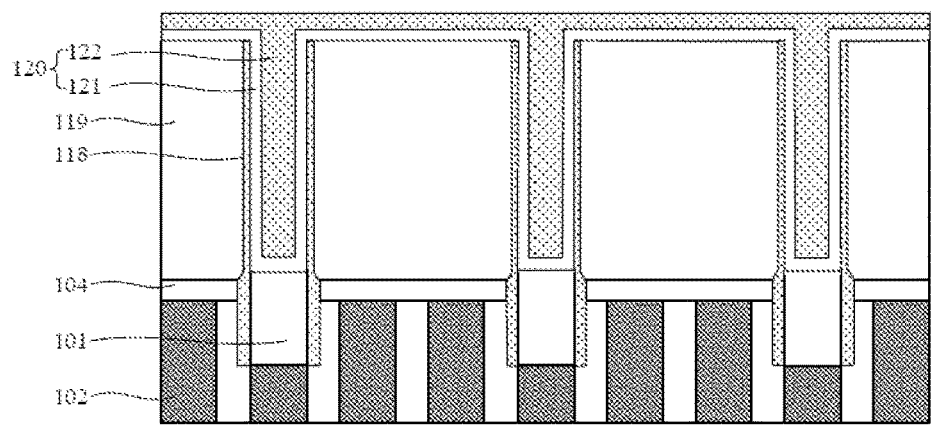
FIG. 11 is an eleventh schematic structural diagram corresponding to a step in a method for manufacturing a memory provided in the first embodiment of the present disclosure.
Figure 12:
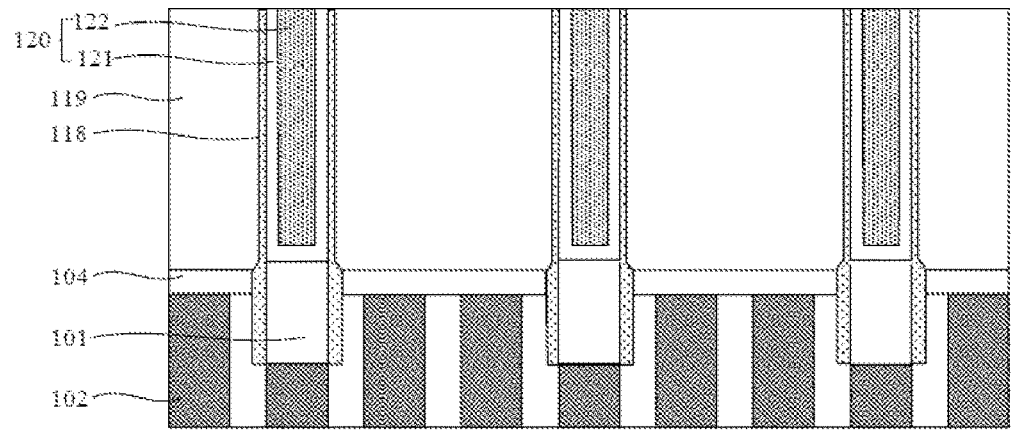
FIG. 12 is a twelfth schematic structural diagram corresponding to a step in a method for manufacturing a memory provided in the first embodiment of the present disclosure.

Referring to FIG. 11 and FIG. 12, the bit line conductive part 120 filling the through hole and covering the bit line contact layer 101 is formed.

The bit line conductive part 120 is a conductive structure in the bit line structure. The bit line conductive part is formed by filling the through hole. The bit line conductive part 120 is supported by the sacrificial layer 119 during the formation. Therefore, even if the width of the bit line conductive part 120 is less, it is unlikely to tilt or collapse. In addition, since no etching process is used, no impurities that may be generated by etching remain in the bit line conductive part 120. Thus, the resistance of the bit line conductive part 120 is reduced, and the operating speed of the memory is increased.

The step of forming the bit line conductive part 120 includes the following operations. A barrier layer 121 is formed on a bottom and a side wall of the through hole. A conductive layer 122 filling up the through hole is formed on a surface of the barrier layer 121.

In the present embodiment, thicknesses of the conductive layer 122 and the barrier layer 121 formed by the atomic deposition layer deposition technology are more uniform. In other embodiments, other deposition technologies can also be used.

A material of the barrier layer 121 includes one or both of tantalum nitride and titanium nitride. Tantalum nitride or titanium nitride can conduct electricity, and has a good ability of blocking the diffusion of the conductive layer 122. A material of the conductive layer 122 includes one or more of ruthenium, tungsten, gold, or silver. The metals of ruthenium, tungsten, gold or silver are low-resistance metals, which can further reduce the resistance of the conductive layer 122 and increase the operating speed of the memory.

In other embodiments, the bit line conductive part may also be of a single-layer structure.

In the present embodiment, as shown in FIG. 11, the formed conductive layer 122 and the barrier layer 121 are also located on the top surface of the sacrificial layer 119. As shown in FIG. 12, the bit line conductive part 120 is planarized to remove the conductive layer 122 and the barrier layer 121 (referring to FIG. 11) which are higher than the top surface of the sacrificial layer 119.

In the present embodiment, a chemical mechanical polishing technology is used to planarize the bit line conductive part 120.

Figure 13:
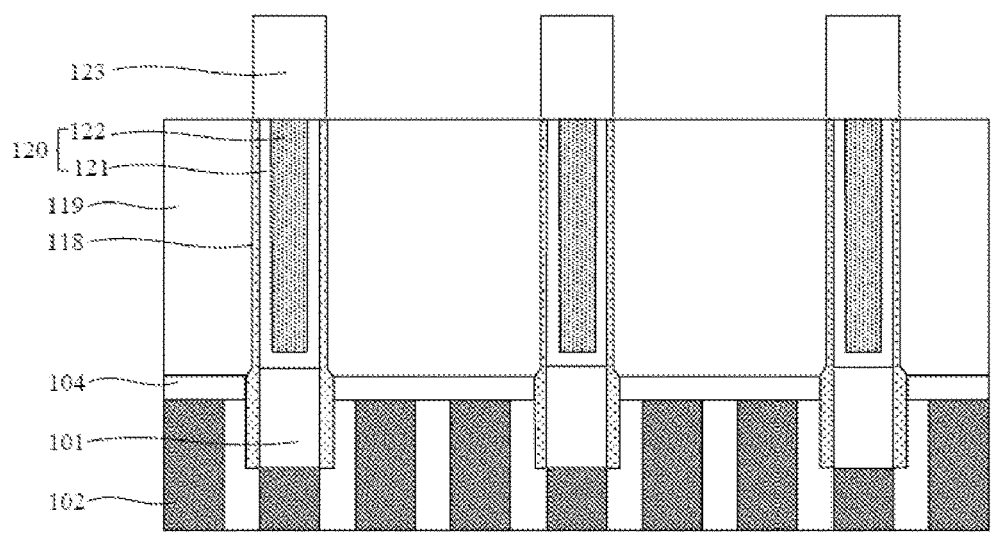
FIG. 13 is a thirteenth schematic structural diagram corresponding to a step in a method for manufacturing a memory provided in the first embodiment of the present disclosure.

Referring to FIG. 13, an insulation cover layer 123 is formed on a top of the bit line conductive part 120.

The insulation cover layer 123 serves as an insulation structure in the bit line structure.

In the present embodiment, the insulation cover layer 123 is formed by an SADP which makes the size of the insulation cover layer 123 more accurate.

Figure 14:
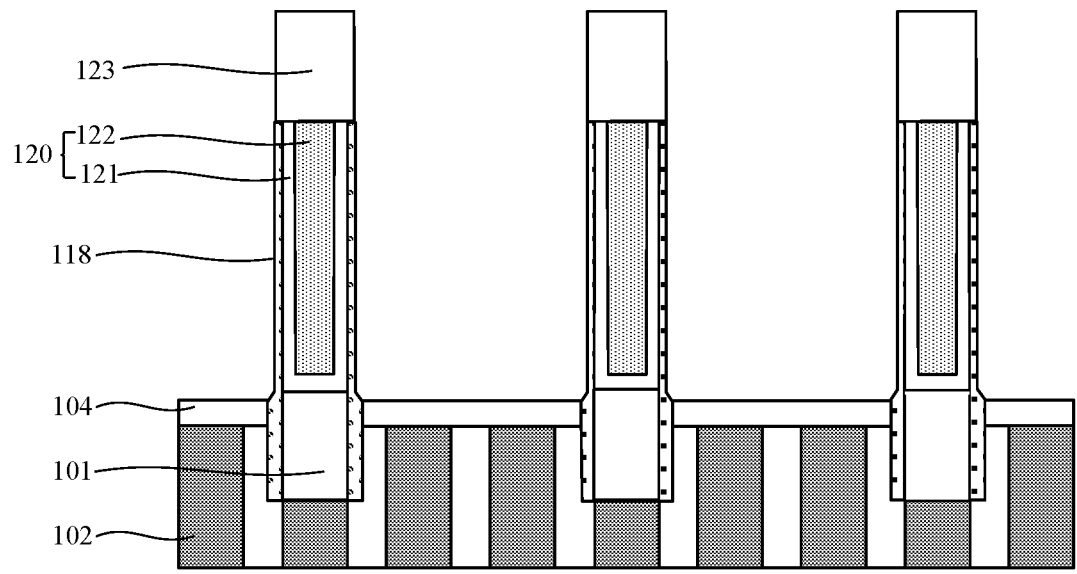
FIG. 14 is a fourteenth schematic structural diagram corresponding to a step in a method for manufacturing a memory provided in the first embodiment of the present disclosure.

Referring to FIG. 14, after the insulation cover layer 123 is formed, the sacrificial layer 119 is removed (referring to FIG. 13).

The etching rate of the sacrificial layer 119 is greater than the etching rate of the insulation cover layer 123, and the etching selectivity ratio of the material of the sacrificial layer 119 to the material of the insulation cover layer 123 is 5-15, such as 8, 10 or 13. A high etching selectivity ratio can ensure that in the process of removing the sacrificial layer 119, the insulation cover layer 123 maintains the original shape and size. In the present embodiment, the wet etching method is used to remove the sacrificial layer 119, and a hydrofluoric acid solution is used as an etchant. In other embodiments, the dry etching method can also be used to remove the sacrificial layer.

Figure 15:
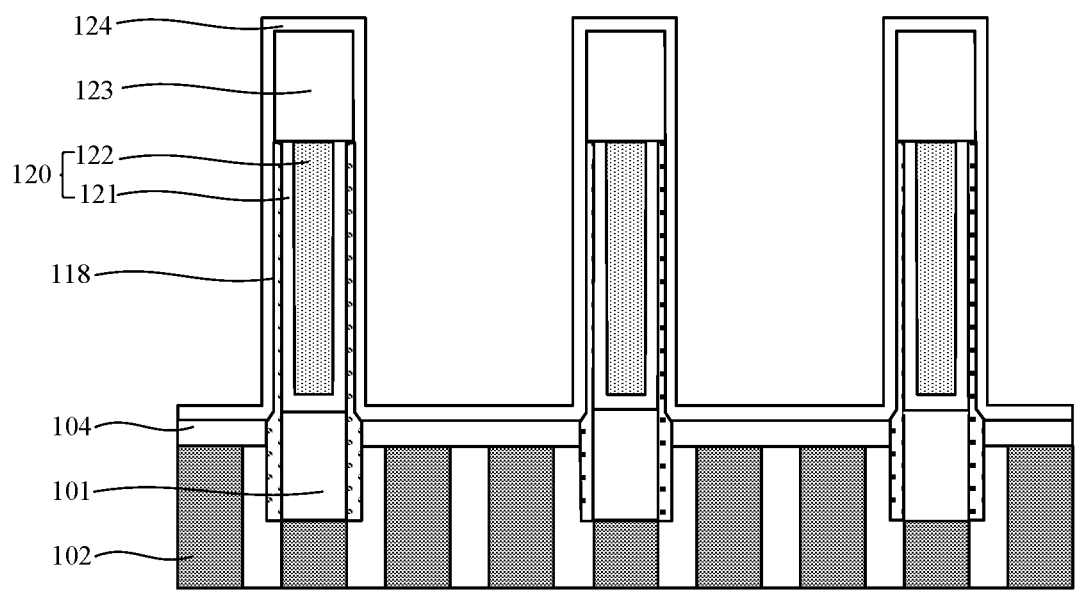
FIG. 15 is a fifteenth schematic structural diagram corresponding to a step in a method for manufacturing a memory provided in the first embodiment of the present disclosure.

Referring to FIG. 15, after the sacrificial layer 119 (referring to FIG. 13) is removed, a protective layer 124 is formed on a surface of the bit line conductive part 120 and a surface of the insulation cover layer 123.

In the present embodiment, the protective layer 124 is also located on the surface of the second isolation layer 104.

In the present embodiment, the protective layer 124 is formed by using the atomic layer deposition technology.

A material of the protective layer 124 includes silicon carbonitride.

To sum up, the resistance of the bit line conductive part 120 of the present embodiment is low, and the operating speed of the memory is high. In addition, the bit line conductive part 120 is supported by the sacrificial layer 119 during the formation, and the bit line conductive part 120 is not prone to tilt or collapse, which further improves the yield and service life of the memory.

Figure 16:
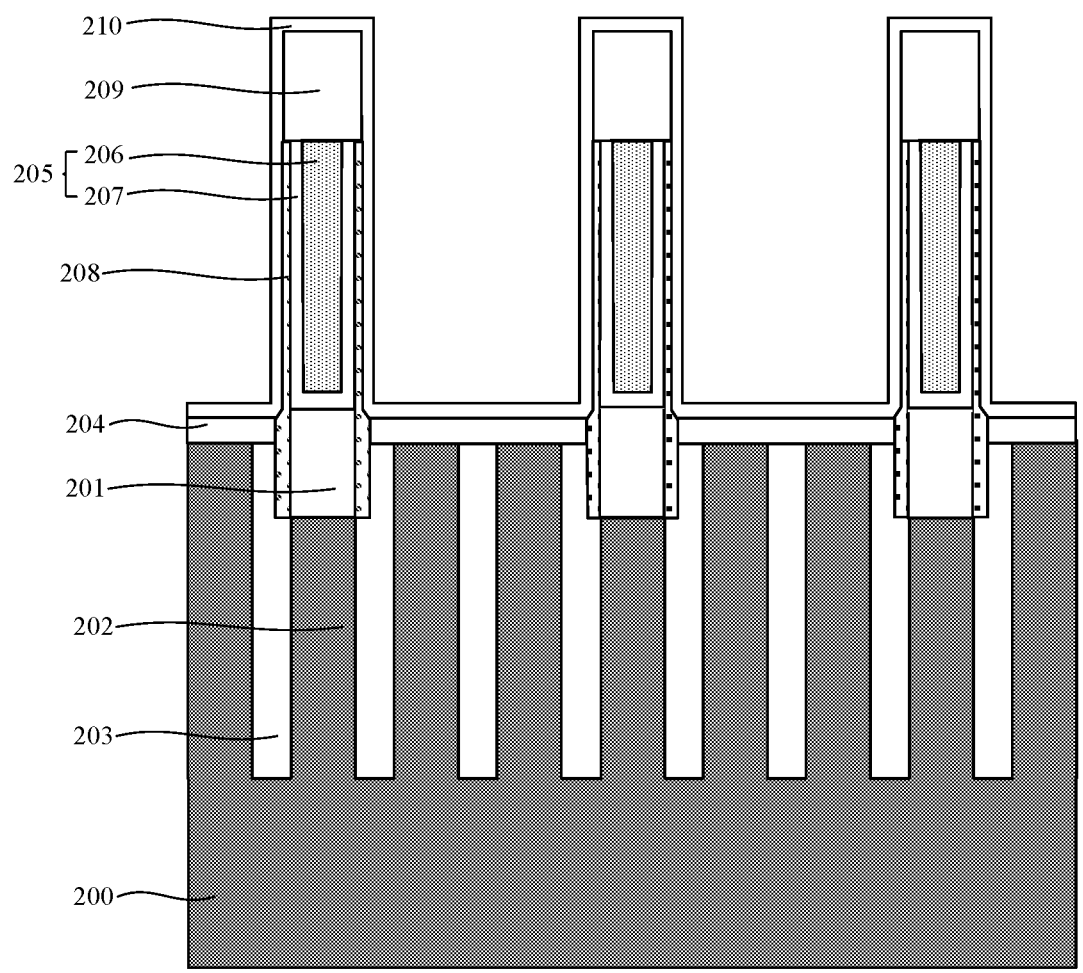
FIG. 16 is a structural schematic diagram of a memory provided by the second embodiment of the present disclosure.

The second embodiment of the present disclosure also provides a memory which can be manufactured by the method for manufacturing a memory in the first embodiment. FIG. 16 is a schematic structural diagram of the memory provided by the present embodiment.

Referring to FIG. 16, the memory includes a substrate 200, a plurality of discrete bit line contact layers 201, and bit line conductive parts 205. A plurality of active areas 202 are provided in the substrate 200, and a bit line contact layer 201 is electrically connected to a active area 202. The bit line conductive parts 205 are located at a top of the bit line contact layers 201.

The memory provided in the present embodiment will be described in detail below with reference to the accompanying drawings.

A first isolation layer 203 is further included between the active areas 202. The first isolation layer 203 is used to isolate the active areas 202.

A second isolation layer 204 is also provided on a surface of the substrate 200. The second isolation layer 204 is used to isolate the bit line contact layer 201.

A bit line conductive part 205 further includes a conductive layer 206 located at a top of the bit line contact layer 201; and a barrier layer 207 located between the bit line contact layer 201 and the conductive layer 206. The barrier layer 207 also covers a side wall of the conductive layer 206.

The material of the conductive layer 206 includes one or more of ruthenium, tungsten, gold or silver. Any of Ruthenium, tungsten, gold or silver is a low-resistance metal, which can reduce the resistance of the conductive layer 206 and increase the operating speed of the memory.

The material of the barrier layer 207 is a conductive material, such as tantalum nitride or titanium nitride.

The thickness of the barrier layer 207 is 2.5 to 6 nm, for example, 3 nm. The barrier layer 207 with this thickness has a good ability to block the diffusion of the conductive layer 206.

A dielectric layer 208 is located on a side wall of the bit line conductive part 205 and a side wall of the bit line contact layer 201. An insulation cover layer 209 is located on a top of the bit line conductive part 205. A protective layer 210 is located on a surface of the insulation cover layer 209 and a surface of the dielectric layer 208. The protective layer 210 is also located on a surface of the second isolation layer 204.

In summary, the material of the conductive layer 206 of the memory provided by the present embodiment is a low-resistance material such as ruthenium, tungsten, gold, or silver. The conductive layer 206 has low resistance, and the memory has a high operating speed. In addition, the barrier layer of the memory provided by the present embodiment has a good ability to block the diffusion of the conductive layer, which can further improve the performance of the memory.

Those of ordinary skill in the art can understand that the above-mentioned implementation modes are specific embodiments for realizing the present disclosure, and in actual applications, various changes can be made in form and details without departing from the spirit and scope of the present disclosure. Any person skilled in the art can make changes and modifications without departing from the spirit and scope of the present disclosure. Therefore, the scope of protection of the present disclosure shall be subject to the scope limited by the claims.

What is claimed is:

1. A method for manufacturing a memory, comprising:
providing a substrate and a plurality of discrete bit line contact layers, a plurality of active areas being provided in the substrate, and the bit line contact layers being one-to-one electrically connected to the active areas;
forming pseudo bit line structures at tops of the bit line contact layers;
forming sacrificial layers filling regions between adjacent pseudo bit line structures, the sacrificial layers being located on side walls of the pseudo bit line structures and side walls of the bit line contact layers;
after forming the sacrificial layers, removing the pseudo bit line structures to form through holes exposing the bit line contact layers; and
forming bit line conductive parts filling the through holes and covering the bit line contact layers.

2. The method for manufacturing a memory of claim 1, wherein said forming the pseudo bit line structures comprises: forming a pseudo bit line layer on the substrate, the pseudo bit line layer covering the bit line contact layers; forming patterned mask layers on the pseudo bit line layer; and etching the pseudo bit line layer by taking the patterned mask layers as a mask to form the pseudo bit line structures.

3. The method for manufacturing a memory of claim 2, wherein said forming the patterned mask layers comprises: forming a plurality of discrete core parts on the pseudo bit line layer; forming a side wall film covering tops and side walls of the core parts and the pseudo bit line layer; etching the side wall film to form side wall layers located on opposite side walls of the core parts; and removing the core parts, the side wall layers serving as the patterned mask layers.

4. A memory manufactured with the method for manufacturing of claim 3, comprising:
the substrate and the plurality of discrete bit line contact layers, the plurality of active areas being provided in the substrate, and the bit line contact layers being one-to-one electrically connected to the active areas; and the bit line conductive parts, located at the tops of the bit line contact layers.

5. A memory manufactured with the method for manufacturing of claim 2, comprising:
the substrate and the plurality of discrete bit line contact layers, the plurality of active areas being provided in the substrate, and the bit line contact layers being one-to-one electrically connected to the active areas; and the bit line conductive parts, located at the tops of the bit line contact layers.

6. The method for manufacturing a memory of claim 1, wherein in a process of removing the pseudo bit line structures, an etching selectivity ratio of a material of the pseudo bit line structures to a material of the sacrificial layers is 5 to 15.

7. The method for manufacturing a memory of claim 6, wherein the material of the pseudo bit line structures comprises silicon nitride, silicon oxynitride, or silicon carbonitride.

8. The method for manufacturing a memory of claim 6, wherein the material of the sacrificial layers comprises silicon oxide.

9. A memory manufactured with the method for manufacturing of claim 4, comprising:
the substrate and the plurality of discrete bit line contact layers, the plurality of active areas being provided in the substrate, and the bit line contact layers being one-to-one electrically connected to the active areas; and the bit line conductive parts, located at the tops of the bit line contact layers.

10. The method for manufacturing a memory of claim 1, further comprising: prior to said forming the sacrificial layers, forming dielectric layers on the side walls of the pseudo bit line structures and the side walls of the bit line contact layers, wherein a material of the dielectric layers is different from the material of the sacrificial layers; and the formed sacrificial layers are located on surfaces of side walls of the dielectric layers instead of on surfaces of the side walls of the pseudo bit line structures and the side walls of the bit line contact layers.

11. The method for manufacturing a memory of claim 10, wherein the material of the dielectric layers comprises a low-dielectric-constant material.

12. The method for manufacturing a memory of claim 1, wherein said forming the bit line conductive parts comprises: forming barrier layers on bottoms and side walls of the through holes; and forming conductive layers on surfaces of the barrier layers, which fill up the through holes.

13. The method for manufacturing a memory of claim 12, wherein a material of the conductive layers comprises one or more of ruthenium, tungsten, gold or silver.

14. A memory manufactured with the method for manufacturing of claim 13, comprising:
the substrate and the plurality of discrete bit line contact layers, the plurality of active areas being provided in the substrate, and the bit line contact layers being one-to-one electrically connected to the active areas; and the bit line conductive parts, located at the tops of the bit line contact layers.

15. The method for manufacturing a memory of claim 12, wherein a material of the barrier layers comprises one or two of tantalum nitride or titanium nitride.

16. The method for manufacturing a memory of claim 12, wherein
the conductive layers and the barrier layers are also located on top surfaces of the sacrificial layers; and
said forming the bit line conductive parts further comprises:
planarizing the bit line conductive parts to remove the conductive layers and the barrier layers which are higher than the top surfaces of the sacrificial layers.

17. A memory manufactured with the method for manufacturing of claim 12, comprising:
the substrate and the plurality of discrete bit line contact layers, the plurality of active areas being provided in the substrate, and the bit line contact layers being one-to-one electrically connected to the active areas; and the bit line conductive parts, located at the tops of the bit line contact layers.

18. The method for manufacturing a memory of claim 1, further comprising: after said forming the bit line conductive parts, forming insulation cover layers at tops of the bit line conductive parts; after forming the insulation cover layers, removing the sacrificial layers; and after removing the sacrificial layers, forming protective layers on surfaces of the bit line conductive parts and surfaces of the insulation cover layers.

19. The method for manufacturing a memory of claim 18, wherein in a process of removing the sacrificial layers, an etching selectivity ratio of a material of the sacrificial layers to a material of the insulation cover layers is 5 to 15.

20. A memory manufactured with the method for manufacturing of claim 1, comprising:
the substrate and the plurality of discrete bit line contact layers, the plurality of active areas being provided in the substrate, and the bit line contact layers being one-to-one electrically connected to the active areas; and the bit line conductive parts, located at the tops of the bit line contact layers.

* * * * *